United States Patent
Violette

(10) Patent No.: US 7,472,579 B2
(45) Date of Patent: Jan. 6, 2009

(54) LIQUID FLOW PROXIMITY SENSOR FOR USE IN IMMERSION LITHOGRAPHY

(75) Inventor: Kevin J. Violette, Woodbury, CT (US)

(73) Assignee: ASML Holding N.V., Veldhoven (NL)

(*) Notice: Subject to any disclaimer, the term of this patent is extended or adjusted under 35 U.S.C. 154(b) by 0 days.

(21) Appl. No.: 11/360,514

(22) Filed: Feb. 24, 2006

(65) Prior Publication Data

US 2006/0137430 A1    Jun. 29, 2006

Related U.S. Application Data

(63) Continuation of application No. 10/683,271, filed on Oct. 14, 2003, now Pat. No. 7,021,119, which is a continuation-in-part of application No. 10/322,768, filed on Dec. 19, 2002, now Pat. No. 7,010,958.

(51) Int. Cl.
    G01B 13/08    (2006.01)
    G01B 13/22    (2006.01)

(52) U.S. Cl. .......................... 73/37.5; 73/105

(58) Field of Classification Search .................. 73/37.5, 73/105
    See application file for complete search history.

(56) References Cited

U.S. PATENT DOCUMENTS

| | | | |
|---|---|---|---|
| 2,571,557 A | 10/1951 | Fortier | 73/37.5 |
| 2,986,924 A | 6/1961 | Becker | 73/37.5 |
| 3,026,714 A | 3/1962 | Evans et al. | 73/37.7 |
| 3,433,408 A | 3/1969 | Bellman et al. | |
| 3,482,433 A | 12/1969 | Gladwyn | 73/37.5 |
| 3,792,609 A | 2/1974 | Blair et al. | 73/861.52 |
| 4,041,584 A | 8/1977 | Williamson | 28/269 |
| 4,179,919 A | 12/1979 | McKechnie | 73/37.5 |
| 4,187,715 A | 2/1980 | Nevitt | 73/37.9 |
| 4,550,592 A | 11/1985 | Dechape | 73/37.5 |
| 4,583,917 A | 4/1986 | Shah | 417/63 |
| 4,953,388 A | 9/1990 | Barada | 73/37.5 |

(Continued)

FOREIGN PATENT DOCUMENTS

GB    1 399 397    7/1975

(Continued)

OTHER PUBLICATIONS

"OEM Products: Flow Restrictors", Mott Corporation, Apr. 30, 2001, available on the Internet <http://web.archive.org>.*

(Continued)

*Primary Examiner*—Daniel S. Larkin
(74) *Attorney, Agent, or Firm*—Sterne, Kessler, Goldstein & Fox P.L.L.C.

(57) ABSTRACT

An apparatus and method for precisely detecting very small distances between a measurement probe and a surface, and more particularly to a proximity sensor using a constant liquid flow and sensing a liquid mass flow rate within a bridge to detect very small distances. Within the apparatus the use of a flow restrictor and/or snubber made of porous material and/or a liquid mass flow rate controller enables detection of very small distances in the nanometer to sub-nanometer range. A further embodiment wherein a measurement channel of a proximity sensor is connected to multiple measurement branches.

18 Claims, 10 Drawing Sheets

U.S. PATENT DOCUMENTS

| | | | | |
|---|---|---|---|---|
| 4,971,517 | A | 11/1990 | Perkey et al. | 415/14 |
| 5,181,532 | A | 1/1993 | Brodefors et al. | 137/14 |
| 5,184,503 | A | 2/1993 | Hancock | 73/37.5 |
| 5,317,898 | A | 6/1994 | Nemeth | 73/37.7 |
| 5,540,082 | A | 7/1996 | Okuyama et al. | 73/37.5 |
| 6,152,162 | A | 11/2000 | Balazy et al. | |
| 6,244,121 | B1 | 6/2001 | Hunter | 73/865.9 |
| 7,010,958 | B2 | 3/2006 | Gajdeczko et al. | |
| 7,021,119 | B2 | 4/2006 | Violette | |

FOREIGN PATENT DOCUMENTS

| | | |
|---|---|---|
| JP | 57-191507 | 11/1982 |

OTHER PUBLICATIONS

Burrows, V.R., "*The Principles and Applications of Pneumatic Gauging*," FWP Journal, Oct. 1976, pp. 31-42.

Derwent Abstract Accession No. 86-324714/49, SU 11225634 A (KIEVE INST) Apr. 23, 1986.

English-language Abstract of JP 57-191507, published Nov. 25, 1982, from http://www19.jpdl.jpo.go.jp/PA1/result/detail/main/wAAA3Ha4FwDA357191507P1.htm, 2 pages (last visited Jan. 6, 2004).

Search Report for Singapore Patent Appl. No. SG 200307486-1, dated Jul. 12, 2004, 4 pages.

Search Report for European Patent Appl. No. 03028485.5, dated Aug. 3, 2004, 7 pages.

Search Report for European Patent Appl. No. 03029016.7, dated Aug. 3, 2004, 7 pages.

Austrian Search Report for Singapore Patent Appl. No. 200307488-7, dated Nov. 11, 2004, 6 pages.

Examination for European Application No. 03 029 016.7 completed Jun. 11, 2008, 6 pgs.

\* cited by examiner

US 7,472,579 B2

LIQUID FLOW PROXIMITY SENSOR FOR USE IN IMMERSION LITHOGRAPHY

CROSS REFERENCE TO RELATED APPLICATIONS

The present application is a continuation of and claims priority under 35 U.S.C. § 120 to U.S. patent application Ser. No. 10/683,271, entitled Liquid Flow Proximity Sensor for Use in Immersion Lithography, filed on Oct. 14, 2003, now U.S. Pat. No. 7,021,119, which in turn is a continuation in part of application Ser. No. 10/322,768, entitled High Resolution Gas Gauge Proximity Sensor, filed Dec. 19, 2002, now U.S. Pat. No. 7,010,958, both of which are incorporated herein in their entireties.

BACKGROUND OF THE INVENTION

1. Field of the Invention

The present invention relates to an apparatus and method for detecting very small distances, and more particularly to proximity sensing with liquid flow.

2. Related Art

Many automated manufacturing processes require the sensing of the distance between a manufacturing tool and the product or material surface being worked. In some situations, such as semiconductor lithography, the distance must be measured with accuracy approaching a nanometer.

The challenges associated with creating a proximity sensor of such accuracy are significant, particularly in the context of photolithography systems. In the photolithography context, in addition to being non-intrusive and having the ability to precisely detect very small distances, the proximity sensor can not introduce contaminants or come in contact with the work surface, typically a semiconductor wafer. Occurrence of either situation may significantly degrade or ruin the semiconductor quality.

Different types of proximity sensors are available to measure very small distances. Examples of proximity sensors include capacitance and optical gauges. These proximity sensors have serious shortcomings when used in photolithography systems because physical properties of materials deposited on wafers may impact the precision of these devices. For example, capacitance gauges, being dependent on the concentration of electric charges, can yield spurious proximity readings in locations where one type of material (e.g., metal) is concentrated. Another class of problems occurs when exotic wafers made of non-conductive and/or photosensitive materials, such as Gallium Arsenide (GaAs) and Indium Phosphide (InP), are used. In these cases, capacitance and optical gauges may provide spurious results.

U.S. Pat. Nos. 4,953,388 and 4,550,592 disclose an alternative approach to proximity sensing that uses an air gauge sensor. An air gauge sensor is not vulnerable to concentrations of electric charges or electrical, optical and other physical properties of a wafer surface. Current semiconductor manufacturing, however, requires that proximity is gauged with high precision on the order of nanometers.

Furthermore, as imaging requirements within lithography methods become more challenging, one alternative approach being used is immersion lithography. Within immersion lithography the gap between the last lens in the projection optic box and a wafer is filled with a liquid to enhance system performance. Such an approach supports printing of smaller feature sizes. In these systems, a wafer to be worked is surrounded by a pool of the liquid. Air gauge sensors, such as those disclosed in U.S. Pat. Nos. 4,953,388 and 4,550,592, would be ineffective in an immersion lithography system.

Immersion lithography systems are generating considerable interest within the microlithography community. The technology enables the index of refraction in the image space, and thus the numerical aperture of the projection system to be greater than unity. As a result, the technology has the potential to extend 193 nm tools used in lithography down to 45 nm, and possibly below. For an immersion lithography system to be effective, however, the index of refraction of the liquid surrounding the work surface must remain constant. Such variables as bubbling and temperature changes in the liquid can effect the index of refraction. A proximity sensor, therefore, must not induce bubbling or temperature changes, and ideally can reduce these effects.

What is needed is a liquid flow proximity sensor that can precisely sense distances in an immersion lithography system.

SUMMARY OF THE INVENTION

The present invention provides a high-resolution liquid flow proximity sensor and method that can precisely sense distances in an immersion lithography system. The liquid flow proximity sensor determines proximity by detecting a difference in measurement and reference standoffs. A standoff is the distance or gap between a nozzle of the proximity sensor and the surface beneath the nozzle.

To determine the standoff difference, a flow of liquid with a constant liquid mass flow rate is metered with a liquid mass flow controller and is forced through two channels—a measurement channel and a reference channel. According to the present invention, porous restrictors are used in the reference channel and measurement channel. The porous restrictors introduce no turbulence, while performing a resistive function required for proper operation of the sensor. In alternate embodiments of the present invention, a porous snubber is placed within the proximity sensor following the liquid mass flow controller and before the proximity sensor bifurcates into the reference and measurement channel. The porous snubber quiets turbulence and reduces possible noise propagated through the channels, and enhances the proximity sensor's precision.

Each channel has a probe on the distal end that is positioned above a surface. A liquid is forced through the channels and emitted through nozzles against respective measurement and reference surfaces. A bridge channel between the reference and measurement channels senses liquid mass flow between the two channels that is induced by differences in the liquid pressure in the reference and measurement channel. The sensed liquid mass flow rate is representative of the difference in reference and measurement standoffs. In other words, the sensed liquid mass flow across the bridge is representative of any difference between a reference standoff of a reference probe and reference surface in the reference channel and a measurement standoff of a measurement probe and a measurement surface in the measurement channel. The liquid flow proximity sensor can provide an indication and invoke a control action based on the sensed mass flow rate.

According to a further aspect of the present invention, different nozzle types can be used as measurement and reference probes. These nozzles enable the sensor to be readily adapted for different types of work surfaces.

According to a further aspect of the present invention, a liquid flow proximity sensor can contain a measurement channel connected to a switching device that connects to multiple measurement branches. Each of the measurement branches has characteristics that are the same as those of a measurement channel in a device that does not contain measurement branches. Multiple measurement branches enhance the ability of a proximity sensor to measure standoffs over a larger region of a measurement surface.

According to a further embodiment of the present invention, a method is provided for liquid flow proximity sensor with a single measurement channel. The method includes steps of distributing liquid flow into measurement and reference channels, and restricting liquid flow evenly across cross-sectional areas of each channel.

According to a further embodiment of the present invention, a method is provided for a liquid flow proximity sensor with multiple measurement branches. The method includes steps of distributing liquid flow into a measurement branch and a reference channel, restricting liquid flow evenly across cross-sectional areas of the reference channel or a measurement branch, and switching between measurement branches. An additional method describes the use of a liquid flow proximity sensor with multiple measurement branches to map the topography of a measurement surface.

Through the use of porous restrictors, a liquid mass flow controller, and/or snubbers, embodiments of the present invention allow measurement of distances based on liquid flow at a high-resolution with nanometer accuracy. The present invention is especially advantageous in immersion photolithography systems and tools. In photolithography systems it is increasingly desired to determine a distance between a suitable geometrical reference of a lithography production tool and semiconductor wafers at high-resolution. Using a high-resolution liquid flow proximity sensing technique further provides independence of wafer proximity measurements from the physical parameters of wafer materials and materials deposited on wafers during semiconductor fabrication at high-resolution performance.

Further embodiments, features, and advantages of the present invention, as well as the structure and operation of the various embodiments of the present invention are described in detail below with reference to accompanying drawings.

BRIEF DESCRIPTION OF THE FIGURES

The present invention is described with reference to the accompanying drawings. In the drawings, like reference numbers indicate identical or functionally similar elements.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

A. Liquid Flow Proximity Sensor

Figure 1A:
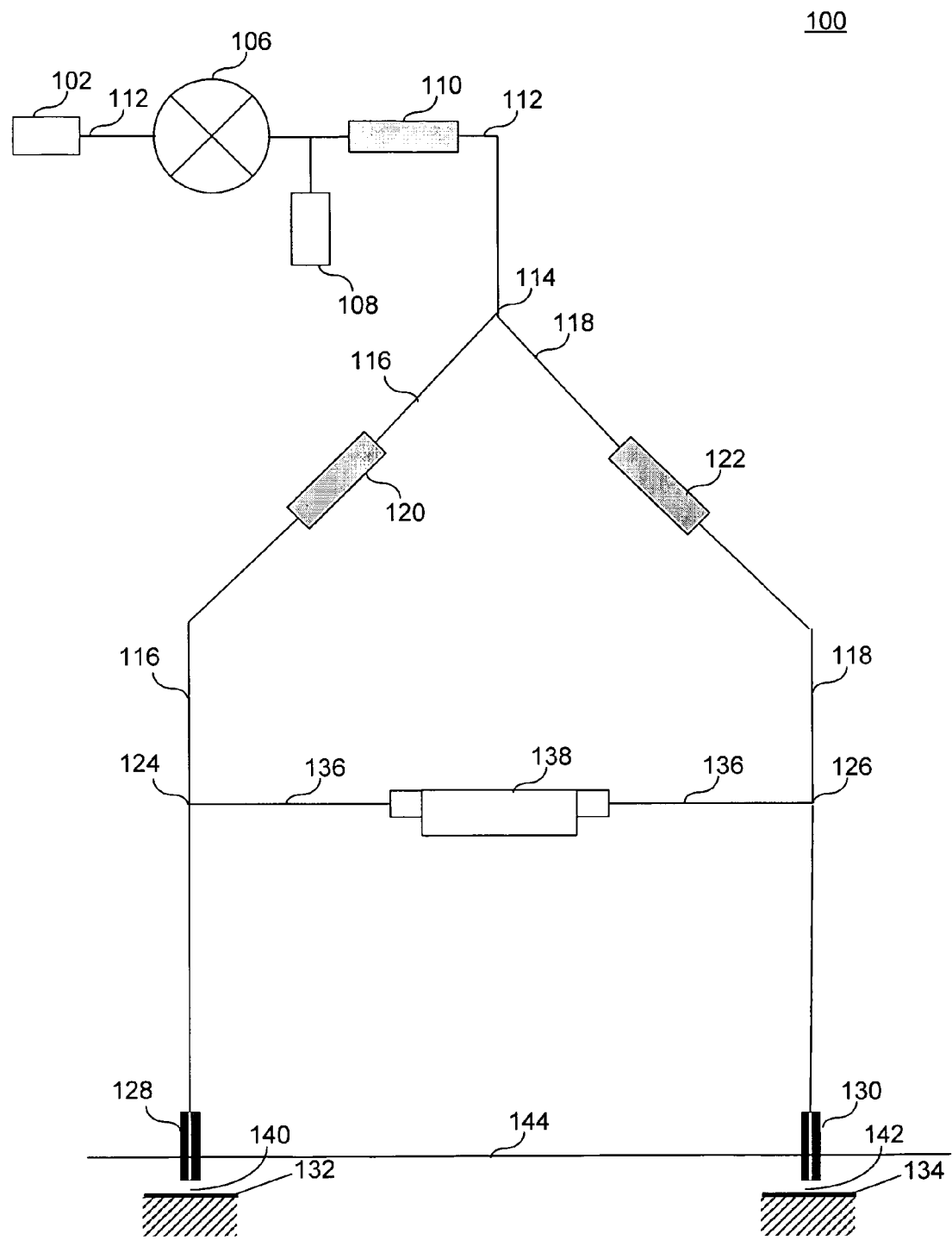
FIG. 1A is a diagram of a liquid flow proximity sensor, according to an embodiment of the present invention.

FIG. 1A illustrates liquid flow proximity sensor 100, according to an embodiment of the present invention. Liquid flow proximity sensor 100 includes liquid mass flow controller 106, central channel 112, measurement channel 116, reference channel 118, measurement channel restrictor 120, reference channel restrictor 122, measurement probe 128, reference probe 130, bridge channel 136 and liquid mass flow sensor 138. Liquid supply 102 injects a liquid at a desired pressure into liquid flow proximity sensor 100. The sensor liquid used in liquid supply 102 can be any liquid suitable for liquid immersion lithography, such as de-ionized water, cyclo-octane, and KRYTOX. The sensor liquid should be compatible with the liquid used as the immersion liquid surrounding the work surface.

Central channel 112 connects liquid supply 102 to liquid mass flow controller 106 and then terminates at junction 114. Liquid mass flow controller 106 maintains a constant flow rate within liquid flow proximity sensor 100. In an alternative embodiment, a pressure regulator can be used in place of liquid mass flow controller 106. Liquid is forced out from liquid mass flow controller 106 through a porous snubber 110, with an accumulator 108 affixed to channel 112. Snubber 110 reduces turbulence introduced by the liquid supply 102, and its use is optional. Upon exiting snubber 110, liquid travels through central channel 112 to junction 114. Central channel 112 terminates at junction 114 and divides into measurement channel 116 and reference channel 118. Liquid mass flow controller 106 injects liquid at a sufficiently low rate to provide laminar and incompressible fluid flow throughout the system to minimize the production of undesired hydraulic noise.

Bridge channel 136 is coupled between measurement channel 116 and reference channel 118. Bridge channel 136 connects to measurement channel 116 at junction 124. Bridge channel 136 connects to reference channel 118 at junction 126. In one example, the distance between junction 114 and junction 124 and the distance between junction 114 and junction 126 are equal.

All channels within liquid flow proximity sensor 100 permit liquid to flow through them. Channels 112, 116, 118, and 136 can be made up of conduits (tubes, pipes, etc.) or any other type of structure that can contain and guide liquid flow through sensor 100. The channels do not have sharp bends, irregularities or unnecessary obstructions that may introduce hydraulic noise, for example, by producing local turbulence or flow instability. The overall lengths of measurement channel 116 and reference channel 118 can be equal or in other examples can be unequal.

Reference channel 118 terminates into reference probe 130. Likewise, measurement channel 116 terminates into measurement probe 128. Reference probe 130 is positioned above reference surface 134. Measurement probe 128 is positioned above measurement surface 132. In the context of photolithography, measurement surface 132 is often a semiconductor wafer or stage supporting a wafer. Reference surface 134 can be a flat metal plate, but is not limited to this example. Both reference probe 130 and measurement probe 128 are positioned such that the bore in which liquid flows out of is submerged beneath the pool of immersion liquid 144 that covers the wafer being worked. Liquid injected by liquid supply 102 is emitted from each of the probes 128, 130 and impinges upon measurement surface 132 and reference surface 134. Nozzles are provided in measurement probe 128 and reference probe 130. Example nozzles are described further below with respect to FIGS. 3A-3E. As stated above, the distance between a nozzle and a corresponding measurement or reference surface is referred to as a standoff.

In one embodiment, reference probe 130 is positioned above a fixed reference surface 134 with a known reference standoff 142. Measurement probe 128 is positioned above measurement surface 132 with an unknown measurement standoff 140. The known reference standoff 142 is set to a desired constant value representing an optimum standoff. With such an arrangement, the backpressure upstream of the measurement probe 128 is a function of the unknown measurement standoff 140; and the backpressure upstream of the reference probe 130 is a function of the known reference standoff 142. If standoffs 140 and 142 are equal, the configuration is symmetrical and the bridge is balanced. Consequently, there is no liquid flow through bridging channel 136. On the other hand, when the measurement standoff 140 and reference standoff 142 are different, the resulting pressure difference between the measurement channel 116 and the reference channel 118 induces a flow of liquid through liquid mass flow sensor 138.

Liquid mass flow sensor 138 is located along bridge channel 136, preferably at a central point. Liquid mass flow sensor 138 senses liquid flows induced by pressure differences between measurement channel 116 and reference channel 118. These pressure differences occur as a result of changes in the vertical positioning of measurement surface 132. For a symmetric bridge, when measurement standoff 140 and reference standoff 142 are equal, the standoff is the same for both of the probes 128, 130 compared to surfaces 132, 134. Liquid mass flow sensor 138 will detect no liquid mass flow, since there will be no pressure difference between the measurement and reference channels. Differences between measurement standoff 140 and reference standoff 142 will lead to different pressures in measurement channel 116 and reference channel 118. Proper offsets can be introduced for an asymmetric arrangement.

Liquid mass flow sensor 138 senses liquid flow induced by a pressure difference or imbalance. A pressure difference causes a liquid flow, the rate of which is a unique function of the measurement standoff 140. In other words, assuming a constant flow rate into liquid gauge 100, the difference between liquid pressures in the measurement channel 116 and the reference channel 118 is a function of the difference between the magnitudes of standoffs 140 and 142. If reference standoff 142 is set to a known standoff, the difference between liquid pressures in the measurement channel 116 and the reference channel 118 is a function of the size of measurement standoff 140 (that is, the unknown standoff in the z direction between measurement surface 132 and measurement probe 128).

Liquid mass flow sensor 138 detects liquid flow in either direction through bridge channel 136. Because of the bridge configuration, liquid flow occurs through bridge channel 136 only when pressure differences between channels 116, 118 occur. When a pressure imbalance exists, liquid mass flow sensor 138 detects a resulting liquid flow, and can initiate an appropriate control function. Liquid mass flow sensor 138 can provide an indication of a sensed flow through a visual display or audio indication. Alternatively, in place of a liquid mass flow sensor, a differential pressure sensor may be used. The differential pressure sensor measures the difference in pressure between the two channels, which is a function of the difference between the measurement and reference standoffs.

The control function may be to calculate the exact gap differences. In another embodiment, the control function may be to increase or decrease the size of measurement gap 140. This is accomplished by moving the measurement surface 132 relative to measurement probe 128 until the pressure difference is sufficiently close to zero, which occurs when there is no longer a difference between the standoffs from measurement surface 132 and reference surface 134.

FIG. 1A illustrates at least three elements of the present invention that limit liquid turbulence and other hydraulic noise to enable the present invention to achieve nanometer accuracy. These elements, liquid mass flow rate controller 106, snubber 110 and restrictors 120, 122, may all be used within an embodiment of the present invention or in any combination depending on the sensitivity desired. For example, if an application required very precise sensitivity, all elements may be used. Alternatively, if an application required less sensitivity, perhaps only snubber 110 would be needed with porous restrictors 120 and 122 replaced by orifices. As a result, the present invention provides a flexible approach to cost effectively meet a particular application's requirements.

Figure 1B:
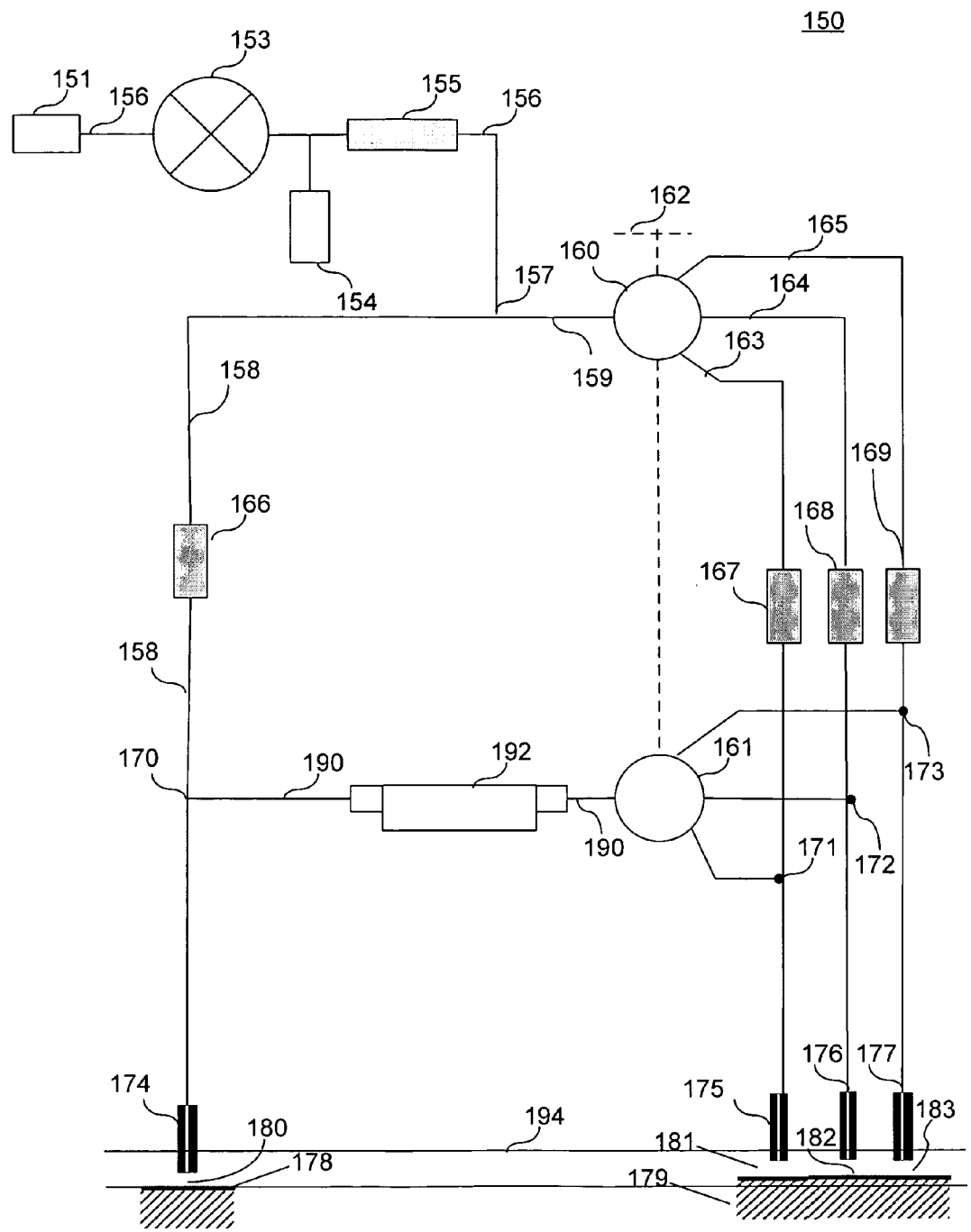
FIG. 1B is a diagram of a liquid flow proximity sensor with multiple measurement branches, according to an embodiment of the present invention.

FIG. 1B illustrates liquid flow proximity sensor 150, according to an embodiment of the present invention. Liquid flow proximity sensor 150 includes many of the same components as liquid flow proximity sensor 100 with similar principles of operation. The difference between the two sensors is that liquid flow proximity sensor 150 has three measurement branches which are comparable to the one measurement channel included within liquid flow proximity sensor 100. Three measurement branches are shown for ease of illustration, and the present invention is not limited to three measurement branches. Any number of measurement branches from two or more may be used.

Liquid flow proximity sensor 150 includes liquid mass flow controller 153, central channel 156, reference channel 158, reference channel restrictor 166, reference probe 174, bridge channel 190 and liquid mass flow sensor 192. In addition, liquid flow proximity sensor 150 includes measurement channel 159. Measurement channel 159 divides into three measurement branches 163, 164 and 165. Measurement branch 163 includes measurement branch restrictor 167 and measurement probe 175. Measurement branch 164 includes measurement branch restrictor 168 and measurement probe 176. Measurement branch 165 includes measurement branch restrictor 169 and measurement probe 177. Finally, liquid flow proximity sensor 150 includes measurement channel switching device 160, bridge channel switching device 161, and switching device lever 162.

Liquid supply 151 injects liquid at a desired pressure into liquid flow proximity sensor 150. As in the case of liquid flow proximity sensor 100, sensor liquid used in liquid supply 151 can be any liquid suitable for liquid immersion lithography, such as de-ionized water, cyclo-octane, and KRYTOX. The sensor liquid should be compatible with the liquid used as the immersion liquid surrounding the work surface.

Central channel 156 connects liquid supply 151 to liquid mass flow controller 153 and then terminates at a junction 157. Liquid mass flow controller 153 maintains a constant flow rate within liquid flow proximity sensor 150. Liquid mass flow controller 153 injects liquid at a sufficiently low rate to provide laminar and incompressible fluid flow throughout the system to minimize the production of undesired hydraulic noise. In an alternative embodiment, a pressure regulator can be used in place of liquid mass flow controller 153. Liquid is forced out from liquid mass flow controller 153 through porous snubber 155, with accumulator 154 affixed to channel 156. Snubber 155 reduces liquid turbulence introduced by the liquid supply 151, and its use is optional. Upon exiting snubber 155, liquid travels through central channel 156 to junction 157. Central channel 156 terminates at junction 157 and divides into measurement channel 159 and reference channel 158.

Measurement channel 159 terminates into measurement channel switching device 160. Measurement channel switching device 160 can be a scanning valve or other type of switching device that serves to switch a measurement channel to one of several measurement branches that are also connected to measurement channel switching device 160. The physical characteristics of a measurement branch are the same as the physical characteristics of a measurement channel. Measurement channel switching device 160 is operated by switching device lever 162. Switching device lever 162 controls which measurement branch 163, 164 or 165 is connected to the measurement channel 159 through measurement channel switching device 160.

Bridge channel 190 is coupled between reference channel 158 and one of the three measurement branches 163, 164 or 165 through bridge channel switching device 161. Bridge channel 190 connects to reference channel 158 at junction 170. Bridge channel 190 terminates in bridge channel switching device 161. Bridge channel switching device 161 can be a scanning valve or other type of switching device that serves to switch a bridge channel to one of the measurement branches. In one example shown in FIG. 1B, three measurement branches 163, 164 and 165 are connected to bridge channel switching device 161 at junctions 171, 172, and 173, respectively. Switching device lever 162 controls which measurement branch 163, 164, or 165 is connected to the bridge channel through bridge channel switching device 161. Switching lever 162 controls both measurement channel switching device 160 and bridge channel switching device 161, such that the same measurement branch will be connected to both measurement channel 159 and bridge channel 190. Alternatively, two independent switching levers can be used.

In one example, the distance between junction 157 and junction 170 and the distance between junction 157 and junction 171, 172 or 173 are equal.

All channels and branches within liquid flow proximity sensor 150 permit liquid to flow through them. Channels 156, 158, 159, and 190, and branches 163, 164, and 165 can be made up of conduits (tubes, pipes, etc.) or any other type of structure that can contain and guide liquid flow through sensor 150. The channels and branches do not have sharp bends, irregularities or unnecessary obstructions that may introduce hydraulic noise, for example, by producing local turbulence or flow instability. The overall lengths of reference channel 158 and measurement channel 159 plus one of measurement branches 163, 164 or 165 can be equal or in other examples can be unequal.

Reference channel 158 terminates into reference probe 174. Likewise, measurement branches 163, 164 and 165 terminate into measurement probes 175, 176 and 177, respectively. Reference probe 174 is positioned above reference surface 178. Measurement probes 175, 176 and 177 are positioned above measurement surface 179. In the context of photolithography, measurement surface 179 is often a semiconductor wafer or stage supporting a wafer. Reference surface 178 can be a flat metal plate, but is not limited to this example. Liquid injected by liquid supply 151 is emitted from reference probe 174 and impinges upon reference surface 178. Likewise, liquid injected by liquid supply 151 is emitted from one of the three measurement probes 175, 176 or 177 and impinges on measurement surface 179. All reference probe and measurement probes are positioned such that the bore in which liquid flows out of is submerged beneath the pool of immersion liquid 194 that covers the wafer being worked. The position of switching device lever 162 determines from which measurement probe liquid is emitted. Nozzles are provided in probes 174, 175, 176 and 177. Example nozzles are described further below with respect to FIGS. 3A-3E. As stated above, the distance between a nozzle and a corresponding measurement or reference surface is referred to as a standoff.

In one embodiment, reference probe 174 is positioned above a fixed reference surface 178 with a known reference standoff 180. Measurement probes 175, 176 and 177 are positioned above measurement surface 179 with unknown measurement standoffs 181, 182 and 183. Measurement standoffs 181, 182 and 183 may be equal or they may be unequal where the topography of a measurement surface varies from region to region. The known reference standoff 180 is set to a desired constant value representing an optimum standoff. With such an arrangement, the backpressure upstream from measurement probe 175, 176 or 177 that is in use is a function of the unknown measurement standoff 181, 182 or 183, respectively; and the backpressure upstream of the reference probe 174 is a function of the known reference standoff 180. If reference standoff 180 and the measurement standoff 181, 182 or 183 that is being used are equal, the configuration is symmetrical and the bridge is balanced. Consequently, there is no liquid flow through bridge channel 190. On the other hand, when the reference standoff 180 and the measurement standoff 181, 182 or 183 corresponding to the measurement branch in use is different, the resulting pressure difference between the reference channel 158 and the measurement branch 163, 164 or 165 that is being used induces a flow of liquid through bridge channel 190.

Liquid mass flow sensor 192 is located along bridge channel 190, preferably at a central point. Liquid mass flow sensor 192 senses liquid flows induced by pressure differences between reference channel 158 and the measurement branch 163, 164 or 165 that is being used. These pressure differences occur as a result of changes in the vertical positioning of measurement surface 179. For a symmetric bridge, when reference standoff 180 and a measurement standoff 181, 182 or 183 corresponding to the measurement branch that is being used are equal, liquid mass flow sensor 192 will detect no liquid mass flow, since there will be no pressure difference between the measurement branch in use and the reference channel. Differences between the reference standoff 180 and a measurement standoff 181, 182 or 183 corresponding to the measurement branch in use will lead to different pressures in reference channel 158 and the measurement branch 163, 164 or 165 being used. Proper offsets can be introduced for an asymmetric arrangement.

Liquid mass flow sensor 192 senses liquid flow induced by a pressure difference or imbalance. A pressure difference causes a liquid flow, the rate of which is a unique function of a measurement standoff 181, 182 or 183. In other words, assuming a constant flow rate into liquid gauge 150, the difference between liquid pressures in a measurement branch 163, 164 or 165 and reference channel 158 is a function of the difference between reference standoff 180 and a measurement standoff 181, 182 or 183 corresponding to the measurement branch that is being used. If reference standoff 180 is set to a known standoff, the difference between liquid pressures in a measurement branch 163, 164 or 165 that is being used and reference channel 158 is a function of the size of a measurement standoff (that is, the unknown standoff in the z direction between measurement surface 179 and a measurement probe 175, 176 or 177 that is being used).

Liquid mass flow sensor 192 detects liquid flow in either direction through bridge channel 190. Because of the bridge configuration, liquid flow occurs through bridge channel 190 only when pressure differences occur between reference channel 158 and a measurement branch 163, 164 or 165 that is being used. When a pressure imbalance exists, liquid mass flow sensor 192 detects a resulting liquid flow, and can initiate an appropriate control function. Liquid mass flow sensor 192 can provide an indication of a sensed flow through a visual display or audio indication. Alternatively, in place of a liquid mass flow sensor, a differential pressure sensor may be used. The differential pressure sensor measures the difference in pressure between the reference channel and a measurement branch, which is a function of the difference between a measurement standoff and the reference standoff.

The control function may be to calculate the exact gap differences. In another embodiment, the control function may be to increase or decrease the size of a measurement standoff 181, 182 or 183. This is accomplished by moving the measurement surface relative to a measurement probe until the pressure difference is sufficiently close to zero, which occurs when there is no longer a difference between the standoffs from a measurement surface and reference surface 178.

In an alternative embodiment liquid flow proximity sensor 150 has multiple reference branches that can be used as the reference channel, but only one measurement branch for use as the measurement channel. This is the opposite arrangement of liquid flow proximity sensor 150, which has multiple measurement branches, but only one reference branch. The design of a liquid flow proximity sensor with multiple reference branches can be determined by an individual skilled in the relevant arts based on the teachings herein. The reference standoffs of each of the reference branches can be adjusted to different heights. When the reference standoffs are set to different heights, the measurement standoff can also be easily adjusted to different heights depending on the sensitivity required. In this way, in cases where additional clearance is needed between a measurement probe and measurement surface, the measurement probe can easily be raised.

FIG. 1B illustrates at least three elements of the present invention that reduce liquid turbulence and other hydraulic noise to enable the present invention to achieve nanometer accuracy. These elements, liquid mass flow rate controller 153, snubber 155 and restrictors 166, 167, 168 and 169 may all be used within an embodiment of the present invention or in any combination depending on the sensitivity desired. For example, if an application required very precise sensitivity, all elements may be used. Alternatively, if an application required less sensitivity, perhaps only snubber 155 would be needed with porous restrictors 166, 167, 168, and 169 replaced by orifices. As a result, the present invention provides a flexible approach to cost effectively meet a particular application's requirements.

Figure 1C:
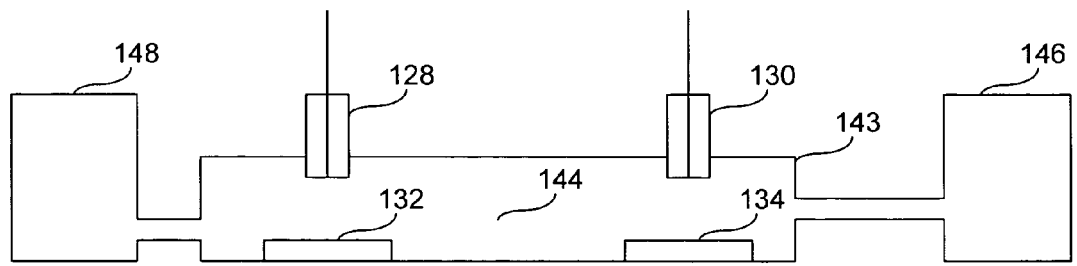
FIG. 1C is a diagram of reference and measurement probes of a liquid flow proximity sensor coupled to a immersion liquid supply system, according to an embodiment of the present invention.

FIG. 1C illustrates a diagram of reference and measurement probes of a liquid flow proximity sensor coupled to an immersion liquid supply system, according to an embodiment of the present invention. Measurement probe 128 and reference probe 130 are submerged in immersion liquid 144. Immersion chamber 143 provides a chamber to contain immersion liquid 144 around measurement surface 132 and reference surface 134. Immersion liquid supply 146 provides a flow of immersion liquid into immersion chamber 143 through one or more entry points. Likewise, immersion liquid pump 148 removes immersion liquid from the immersion chamber 143 through one or more entry points. Control sensors and circuitry are used to maintain a constant temperature and volume of immersion liquid 144 around measurement surface 132.

1. Flow Restrictors

According to one embodiment of the present invention and referring to liquid flow proximity sensor 100, measurement channel 116 and reference channel 118 contain restrictors 120, 122. Each restrictor 120, 122 restricts the flow of liquid traveling through the respective measurement channel 116 and reference channel 118. Measurement channel restrictor 120 is located within measurement channel 116 between junction 114 and junction 124. Likewise, reference channel restrictor 122 is located within reference channel 118 between junction 114 and junction 126. In one example, the distance from junction 114 to measurement channel restrictor 120 and the distance from junction 114 to reference channel restrictor 122 are equal. In other examples, the distances are not equal. There is no inherent requirement that the sensor be symmetrical, however, the sensor is easier to use if it is geometrically symmetrical.

Figure 2:
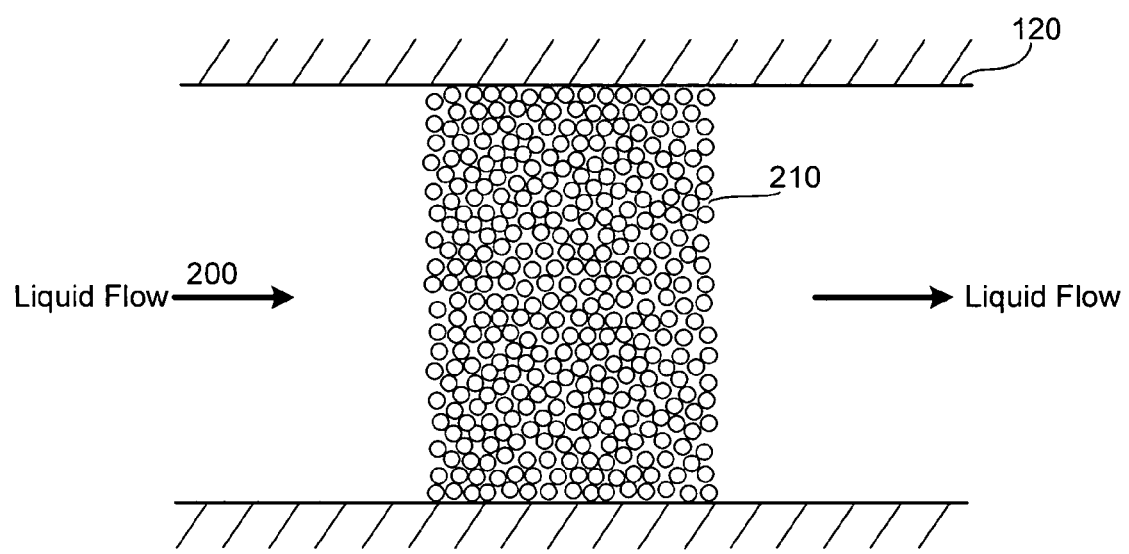
FIG. 2 is a diagram that provides a cross sectional view of a restrictor, according to an embodiment of the present invention.

According to a further feature of the present invention, each restrictor 120, 122 consists of a porous material, such as polyethylene or sintered stainless steel. FIG. 2 provides a cross-sectional image of restrictor 120 having porous material 210 through which a liquid flow 200 passes. Measurement channel restrictor 120 and reference channel restrictor 122 have substantially the same dimensions and permeability characteristics. Restrictors typically range in length from 2 to 15 mm, but are not limited to these lengths. Measurement channel restrictor 120 and reference channel restrictor 122 restrict liquid flow evenly across the cross-sectional areas of the channels 116, 118. Within liquid flow proximity sensor 150, porous restrictors 166, 167, 168 and 169 with above mentioned characteristics are also used to achieve these advantages.

The restrictors serve two key functions. First, they mitigate the pressure and flow disturbances present in liquid flow proximity sensor 100, most notably disturbances generated by liquid mass flow controller 106 or sources of acoustic pick-up. Second, they serve as the required resistive elements within the bridge.

Exemplary embodiments of a liquid flow proximity sensor have been presented. The present invention is not limited to this example. This example is presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the present invention.

2. Snubber

According to one embodiment of the present invention and referring to liquid flow proximity sensor 100, channel 112 contains snubber 110. Similar to the operation of a restrictor, snubber 110 reduces liquid turbulence introduced by liquid supply 102 and isolates the liquid mass flow sensor from acoustic pick-up in the upstream part of the liquid flow proximity sensor. Snubber 110 is located within channel 112 between accumulator 108 and junction 114. According to a further feature of the present invention, snubber 110 consists of a porous material, such as polyethylene or sintered stainless steel. Snubber 155 used within liquid flow proximity sensor 150 has the same characteristics as snubber 110 and is used to achieve the same benefits.

3. Nozzles

In liquid flow proximity sensor 100, different types of nozzles may be used as reference probe 130 and measurement probe 128 depending on a particular application. Similarly different types of nozzles may be used in liquid flow proximity sensor 150 for reference probe 174 and measurement probes 175, 176, and 177. The choice of nozzle type, among other things, depends on the footprint (measurement area) that is required.

Figure 3A:
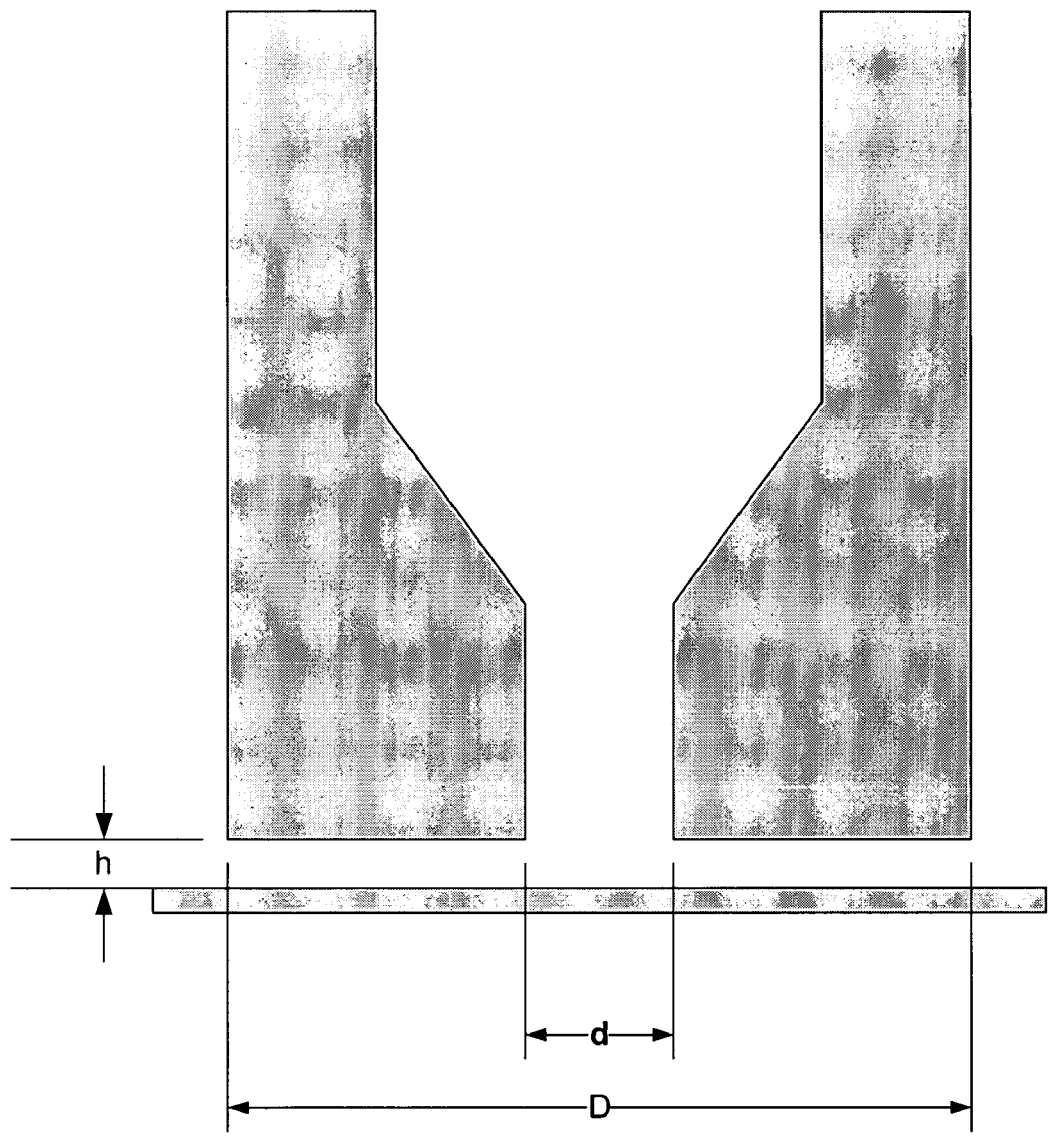
FIG. 3A is a diagram that shows the basic characteristics of a nozzle.

The basic configuration of the liquid flow proximity sensor nozzle 300 is characterized by a flat end surface that is parallel to the surface of the measurement surface, as shown in FIG. 3A. The geometry of a nozzle is determined by the gauge standoff, h, and the inner diameter, d. Generally, the dependence of the nozzle pressure drop on the nozzle outer diameter D is weak, if D is sufficiently large.

Figure 3B:
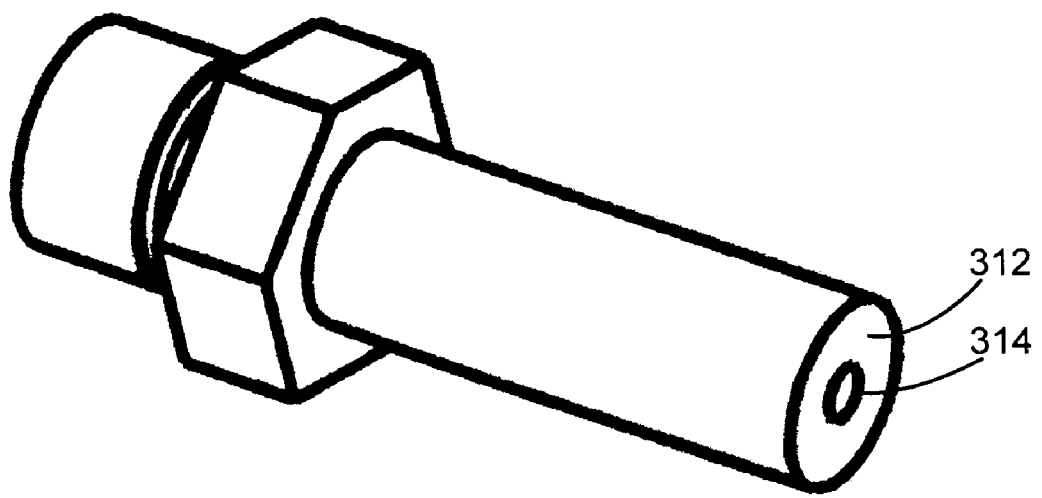
FIG. 3B is a diagram that shows a perspective view of a nozzle that may be used in a reference probe or a measurement probe, according to an embodiment of the present invention.
Figure 3C:
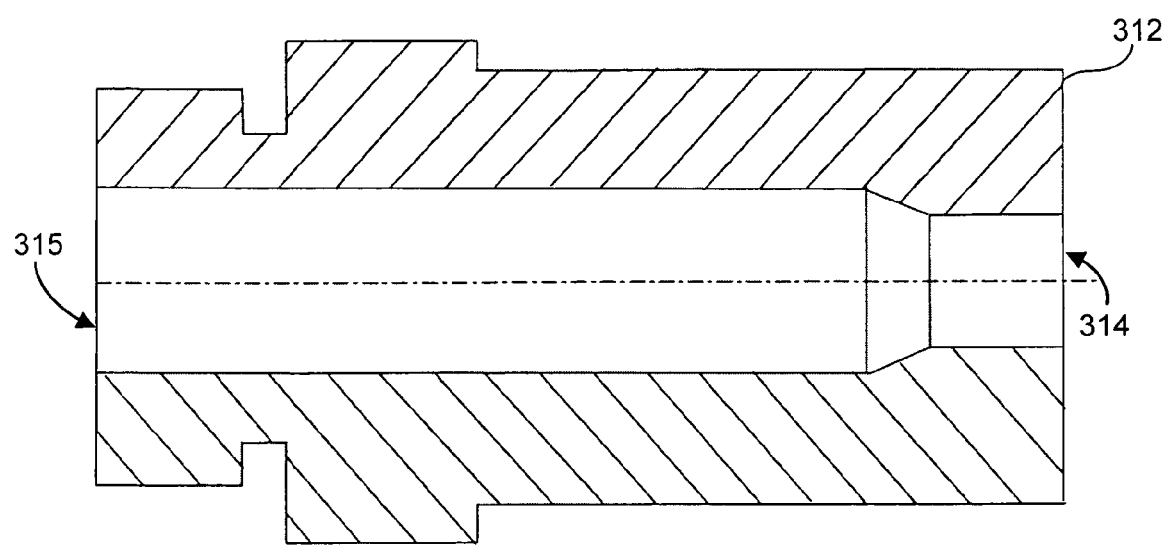
FIG. 3C is a diagram that shows a cross sectional view of the nozzle illustrated in FIG. 3B, according to an embodiment of the present invention.

FIGS. 3B and 3C illustrate a nozzle 310 that may be used as a reference probe or measurement probe, according to an embodiment of the present invention. Nozzle 310 includes front surface 312, liquid bore front opening 314, and liquid bore rear opening 315.

Nozzle 310 is affixed to both measurement channel 116 and reference channel 118. In one embodiment, two identical nozzles 310 serve as measurement probe 128 and reference probe 130. In principle, the nozzles do not need to be identical. Nozzle 310 is affixed to measurement channel 116. Front surface 312 should be parallel to measurement surface 132. Liquid travelling through measurement channel 116 enters nozzle 310 through liquid bore rear opening 315 and exits through liquid bore front opening 314. Similarly, nozzle 310 is affixed to reference channel 118. Front surface 312 is parallel to reference surface 134. Liquid travelling through reference channel 118 enters nozzle 310 through liquid bore rear opening 315 and exits through liquid bore front opening 314. The diameter of liquid bore front opening 314 can vary depending upon a particular application. In one example, the inner diameter of liquid bore front opening 314 is between approximately 0.5 and 2.5 millimeters (mm).

Figure 3D:
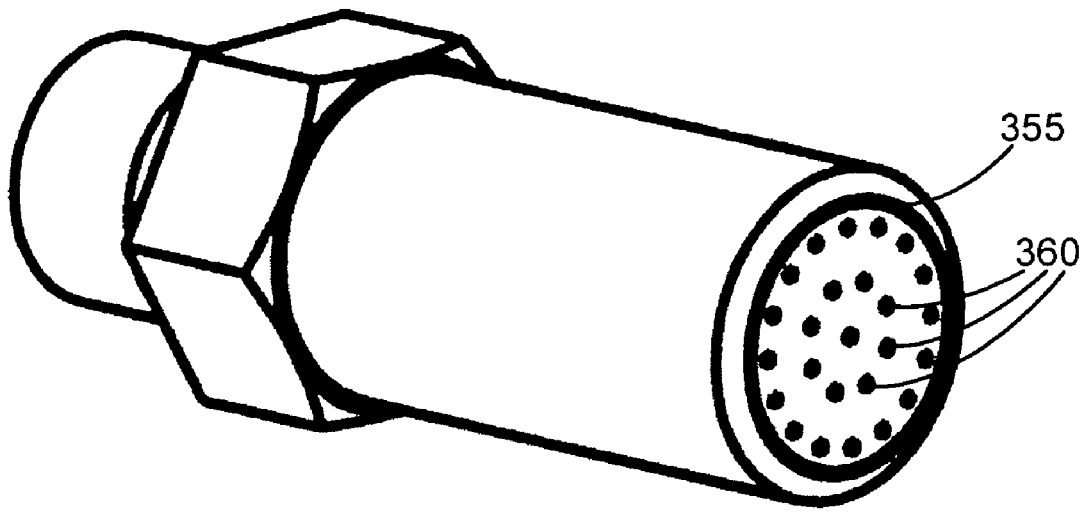
FIG. 3D is a diagram that shows a perspective view of a shower-head nozzle that may be used in a reference probe or a measurement probe, according to an embodiment of the present invention.
Figure 3E:
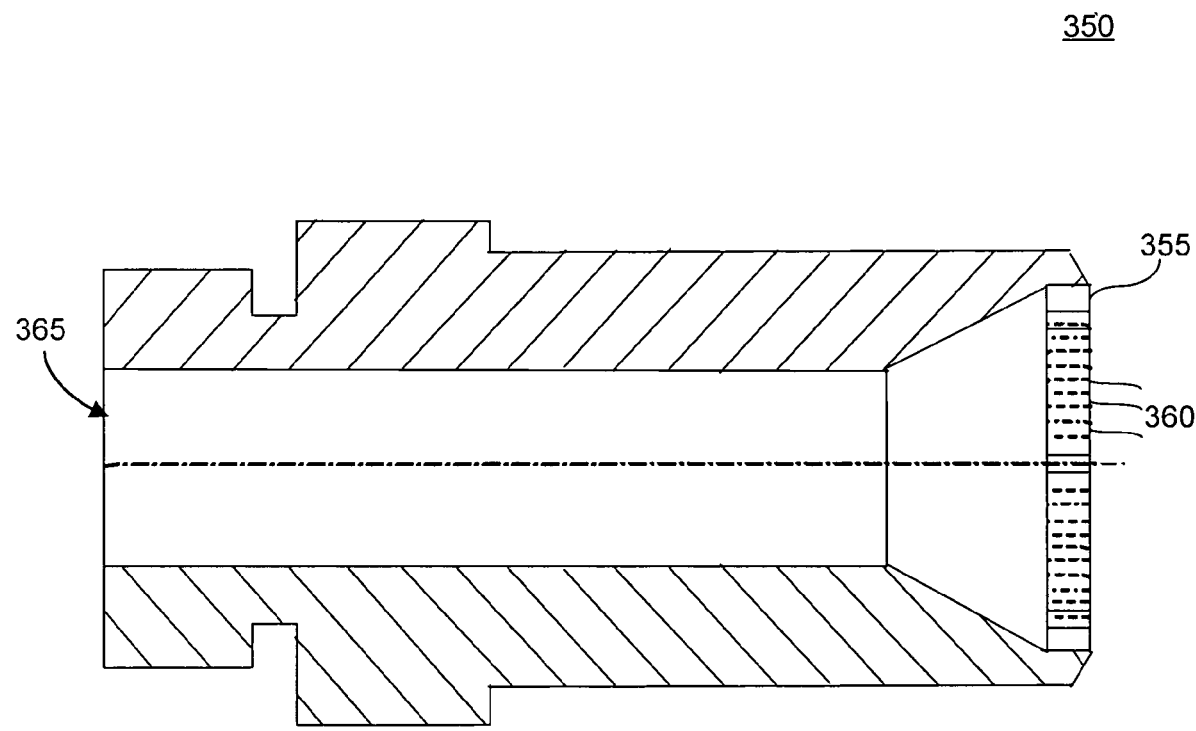
FIG. 3E is a diagram that shows a cross sectional view of the nozzle illustrated in FIG. 3D, according to an embodiment of the present invention.

FIGS. 3D and 3E illustrate shower-head nozzle 350 that may be used as the reference and measurement probes, according to an embodiment of the present invention. Shower-head nozzle 350 includes front surface 355, a plurality of liquid bore front openings 360, and a liquid bore rear opening 365. The multiple liquid bore front openings distribute pressure across a wider area of measurement surface 132 than nozzle 310. A shower-head nozzle is principally used for lowering spatial resolution to evenly integrate proximity measurements over a wider spatial area. An alternative approach would be to use a nozzle that contains a porous filter.

A shower-head nozzle 350 is affixed to both measurement channel 116 and reference channel 118. In one embodiment, two identical shower-head nozzles 350 serve as measurement probe 128 and reference probe 130. In principle, the nozzles do not need to be identical. Shower-head nozzle 350 is affixed to measurement channel 116. Front surface 355 is parallel to measurement surface 132. Liquid travelling through measurement channel 116 enters shower-head nozzle 350 through liquid bore rear opening 365 and exits through a plurality of liquid bore front openings 360. Similarly, shower-head nozzle 350 is affixed to reference channel 118. Front surface 355 is parallel to reference surface 134. Liquid travelling through reference channel 118 enters shower-head nozzle 350 through liquid bore rear opening 365 and exits through a plurality of liquid bore front openings 360. The use of nozzles has been explained with reference to liquid flow proximity sensor 100 for ease of illustration. Each of the nozzle types may also be used with liquid flow proximity sensor 150, wherein the nozzles would be affixed to each of the measurement branch probes and the reference channel probe.

Exemplary embodiments of different types of nozzles have been presented. The present invention is not limited to these examples. The examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the present invention.

B. Methods

Figure 4:
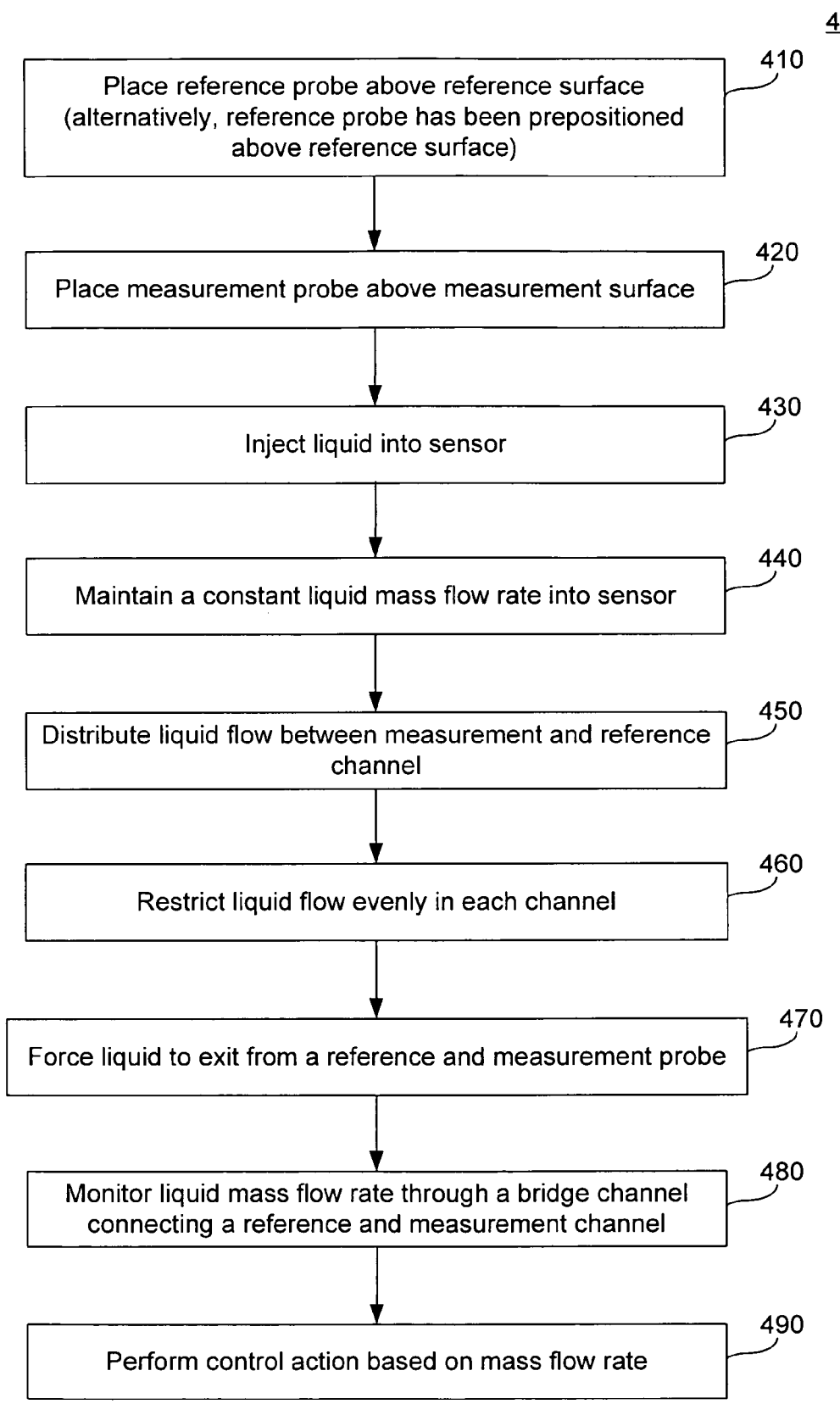
FIG. 4 is a flowchart diagram that shows a method for using a liquid flow proximity sensor to detect very small distances and perform a control action, according to an embodiment of the present invention.

The process illustrated in FIG. 4 presents a method 400 for using liquid flow to detect very small distances and perform a control action (steps 410-490). For convenience, method 400 is described with respect to liquid flow proximity sensor 100. However, method 400 is not necessarily limited by the structure of sensor 100, and can be implemented with liquid flow proximity sensor 150 or a sensor with a different structure.

The process begins in step 410. In step 410, an operator or mechanical device places a reference probe above a reference surface. For example, an operator or mechanical device positions reference probe 130 above reference surface 134 with known reference standoff 142. Alternatively, the reference standoff can be arranged within the sensor assembly, that is, internal to the sensor assembly. The reference standoff is pre-adjusted to a particular value, which typically would be maintained constant. In step 420, an operator or mechanical device places a measurement probe above a measurement surface. For example, an operator or mechanical device positions measurement probe 128 above measurement surface 132 to form measurement gap 140.

In step 430, liquid is injected into a sensor. For example, a measurement liquid is injected into liquid flow proximity sensor 100 with a constant liquid mass flow rate. In step 440, a constant liquid flow rate into a sensor is maintained. For example, liquid mass flow controller 106 maintains a constant liquid flow rate. In step 450, liquid flow is distributed between measurement and reference channels. For example, liquid flow proximity sensor 100 causes the flow of the measurement liquid to be evenly distributed between measurement channel 116 and reference channel 118.

In step 460, liquid flow in the measurement channel and the reference channel is restricted evenly across cross-sectional areas of the channels. Measurement channel restrictor 120 and reference channel restrictor 122 restrict the flow of liquid to reduce hydraulic noise and serve as a resistive element in liquid flow proximity sensor 100.

In step 470, liquid is forced to exit from a reference and measurement probe. For example, liquid flow proximity sensor 100 forces liquid to exit measurement probe 128 and reference probe 130. In step 480, a flow of liquid is monitored through a bridge channel connecting a reference channel and a measurement channel. In step 490, a control action is performed based on a pressure difference between the reference and measurement channel. For example, liquid mass flow sensor 138 monitors liquid mass flow rate between measurement channel 116 and reference channel 118. Based on the liquid mass flow rate, liquid mass flow sensor 138 initiates a control action. Such control action may include providing an indication of the sensed liquid mass flow, sending a message indicating a sensed liquid mass flow, or initiating a servo control action to reposition the location of the measurement surface relative to the reference surface until no liquid mass flow or a fixed reference value of liquid mass flow is sensed.

The above method may be adapted to use with a sensor that has multiple measurement branches, such as liquid flow proximity sensor 150. When liquid flow proximity sensor 150 is used, an additional step may be incorporated that includes switching from the use of one measurement branch to another measurement branch.

The use of a liquid flow proximity sensor 150 can also better facilitate the mapping of the topography of a measurement surface. This mapping may be accomplished through the principles described in the above method, wherein topography measurements are taken over a particular region of a work surface using one of the measurement branches. If a topography mapping is desired of a different region, the flow of liquid may be switched to a different measurement branch to map the topography of a different region. Because of limitations that may exist in the ability to move a measurement surface, a proximity sensor with multiple branches can be used in some instances to more readily map the topography of a measurement surface than a proximity sensor with only one measurement channel.

For example, in one embodiment a method for mapping the topography includes injecting liquid into a proximity sensor, such as liquid flow proximity sensor 150, and measuring the topography of a region of a measurement surface by taking a series of measurements using one of the measurement branches. Upon completing the mapping of the region that can be mapped by a particular measurement branch, the proximity sensor would be switched to a different measurement branch to repeat the mapping process for the region reached by that measurement branch. The process would be repeated until the surface for which a topography mapping is desired is completed. The measurement surface may be a semiconductor wafer or other measurement surface for which a topography mapping is desired.

Additional steps or enhancements to the above steps known to person skilled in the relevant art(s) form the teachings herein are also encompassed by the present invention.

The present invention has been described with respect to FIGS. 1-4 with reference to a liquid. In one embodiment the liquid is water. The invention is not limited to the use of water. The choice of a particular liquid to use will be based on the liquid in which a wafer is submerged in as part of the immersion lithography process. In many cases, the liquid used within the liquid flow proximity sensor will be the same as the liquid used for the immersion lithography process, however, this may not always be the case.

D. CONCLUSION

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of method steps illustrating the performance of specified functions and relationships thereof. The boundaries of these method steps have been arbitrarily defined herein for the convenience of the description. Alternate boundaries can be defined so long as the specified functions and relationships thereof are appropriately performed. Any such alternate boundaries are thus within the scope and spirit of the claimed invention. Thus, the breadth and scope of the present invention should not be limited by any of the above-described exemplary embodiments, but should be defined only in accordance with the following claims and their equivalents.

What is claimed is:

1. A liquid flow lithography proximity sensor, comprising:
   a junction that divides liquid input into the liquid flow proximity sensor into a reference channel and a measurement channel;
   a first porous flow restrictor placed along the reference channel, wherein said first porous flow restrictor evenly restricts liquid flow through the reference channel;
   a second porous flow restrictor placed along the measurement channel, wherein said second porous flow restrictor evenly restricts liquid flow through the measurement channel;
   a reference probe at an end of the reference channel, whereby liquid exits the reference channel through the reference probe and travels across a reference standoff to impinge upon a reference surface;
   a measurement probe at an end of the measurement channel, whereby liquid exits the measurement channel through the measurement probe and travels across a measurement standoff to impinge upon a lithographic measurement surface; and
   a liquid mass flow sensor coupled between the reference and measurement channels for sensing the flow of liquid therebetween, whereby, the difference in standoffs between the reference and measurement surfaces can be sensed;
   wherein the liquid flow sensed by said liquid mass flow sensor is indicative of a difference between the measurement standoff and the reference standoff in a nanometer range.

2. The sensor of claim 1, further comprising a liquid mass flow controller located before said junction to output a constant liquid mass flow rate of liquid.

3. The sensor of claim 2, further comprising a snubber located after said liquid mass flow controller to reduce liquid turbulence.

4. The sensor of claim 1, further comprising a pressure regulator located before said junction to output a constant liquid mass flow rate of liquid.

5. The sensor of claim 1, further comprising a snubber located prior to said junction.

6. The sensor of claim 1, wherein said first and second porous flow restrictors are made of respective first and second porous materials, said first and second porous materials having substantially the same permeability characteristics.

7. The sensor of claim 6, wherein said first porous material and said second porous material are identical and include polyethylene.

8. The sensor of claim 6, wherein said first porous material and said second porous material are identical and include sintered stainless steel.

9. The sensor of claim 1, wherein said first and second porous flow restrictors each have a length between approximately 2 and 15 mm.

10. The sensor of claim 1, wherein said reference probe and said measurement probe each comprise one or more liquid bores.

11. The sensor of claim 10, wherein said reference probe and said measurement probe and each liquid bore extend along a direction perpendicular to the reference surface and the measurement surface.

12. The sensor of claim 1, wherein said reference probe and said measurement probe each comprise a single liquid bore having an inner diameter between approximately 0.5 and 2.5 mm.

13. The sensor of claim 1, wherein said reference probe and said measurement probe each comprise a nozzle.

14. The sensor of claim 1, wherein said reference probe and said measurement probe each comprise a shower head nozzle.

15. A method for sensing a difference in a reference standoff and a measurement standoff within a lithography apparatus, comprising the steps of:
   (a) distributing a flow of liquid between a measurement channel and a reference channel;
   (b) restricting the flow of liquid substantially evenly across cross-sectional areas of both the measurement and reference channels;
   (c) forcing the flow of liquid through porous restrictors located in the measurement and reference channels;
   (d) outputting liquid from the reference and measurement channels through nozzles to impinge upon a lithographic reference surface and a lithographic measurement surface, respectively; and
   (e) sensing a liquid mass flow rate across a bridge channel that connects the reference and measurement channels, the liquid mass flow rate being representative of the magnitude of a difference between a measurement standoff and a reference standoff, wherein the liquid mass flow rate sensed is indicative of a difference between the measurement standoff and the reference standoff in a nanometer range.

16. The method of claim 15, wherein step (e) comprises the step of monitoring the liquid mass flow rate across a bridge channel that connects the reference and measurement channels, the liquid mass flow rate being representative of the magnitude of the difference between the measurement standoff and the reference standoff.

17. The method of claim 15, wherein step (e) comprises the step of monitoring liquid pressure differences in the reference and measurement channels, the liquid pressure differences being representative of the magnitude of the difference between the measurement standoff and the reference standoff.

18. The method as in claim 15, further comprising performing a control action in response to said sensing step.

* * * * *